United States Patent
Bueb et al.

(10) Patent No.: US 11,810,622 B2
(45) Date of Patent: Nov. 7, 2023

(54) DETECTING FAILURE OF A THERMAL SENSOR IN A MEMORY DEVICE

(71) Applicant: Micron Technology, Inc., Boise, ID (US)

(72) Inventors: Christopher J. Bueb, Folsom, CA (US); Aravind Ramamoorthy, Rocklin, CA (US)

(73) Assignee: Micron Technology, Inc., Boise, ID (US)

( * ) Notice: Subject to any disclaimer, the term of this patent is extended or adjusted under 35 U.S.C. 154(b) by 67 days.

(21) Appl. No.: 17/677,332

(22) Filed: Feb. 22, 2022

(65) Prior Publication Data

US 2022/0180935 A1    Jun. 9, 2022

Related U.S. Application Data

(63) Continuation of application No. 17/003,829, filed on Aug. 26, 2020, now Pat. No. 11,282,577.

(51) Int. Cl.
*G11C 16/04* (2006.01)
*G11C 16/22* (2006.01)
*G11C 11/56* (2006.01)
*G11C 16/26* (2006.01)
*G11C 16/10* (2006.01)

(52) U.S. Cl.
CPC .......... *G11C 16/22* (2013.01); *G11C 11/5628* (2013.01); *G11C 11/5642* (2013.01); *G11C 11/5671* (2013.01); *G11C 16/0483* (2013.01); *G11C 16/10* (2013.01); *G11C 16/26* (2013.01)

(58) Field of Classification Search
CPC . G11C 11/5628; G11C 16/10; G11C 11/5642; G11C 16/26; G11C 11/5671; G11C 16/0483; G11C 7/04
See application file for complete search history.

(56) References Cited

U.S. PATENT DOCUMENTS

| | | | |
|---|---|---|---|
| 2006/0077742 A1 | 4/2006 | Shim et al. | |
| 2011/0019713 A1* | 1/2011 | Sinha | G01K 15/005 374/1 |
| 2017/0200492 A1 | 7/2017 | Yang et al. | |
| 2020/0126612 A1* | 4/2020 | Mayer | G06F 1/3275 |

* cited by examiner

*Primary Examiner* — Uyen Smet
(74) *Attorney, Agent, or Firm* — Lowenstein Sandler LLP (57) ABSTRACT

Respective values of a subset of the plurality of memory cells of a memory device are compared to a pattern of pre-programmed memory cells. The pattern pre-programmed memory cells comprise representations of values of the pattern of pre-programmed memory cells when a temperature criterion is satisfied. Responsive to determining that at least a threshold number of the respective values of the subset matches the pattern of pre-programmed memory cells, a temperature reading from a thermal sensor coupled to the memory device is identified. Responsive to determining that the temperature reading does not correspond to a temperature criterion, determining that the thermal sensor has failed.

20 Claims, 6 Drawing Sheets

Perform a program operation on a subset of a plurality of memory cells
210

↓

Perform a sense operation on the subset of the plurality of memory cells to determine respective values stored in the subset of the plurality of memory cells
220

↓

Identify one or more patterns of pre-programmed memory cells, wherein the one or more patterns comprise representations of values of the pre-programmed memory cells when at least one of: a first temperature criterion or a second temperature criterion is satisfied
230

↓

Compare the respective values of the subset of the plurality of memory cells to the values of the pre-programmed memory cells in the one or more patterns
240

↓

Determine, based on the comparison, whether a reading from a thermal sensor coupled to the memory device satisfies an accuracy criterion
250

DETECTING FAILURE OF A THERMAL SENSOR IN A MEMORY DEVICE

RELATED APPLICATIONS

The present application is a continuation of U.S. patent application Ser. No. 17/003,829, filed Aug. 26, 2020, which is incorporated by reference herein.

TECHNICAL FIELD

Embodiments of the disclosure relate generally to memory sub-systems, and more specifically, relate to detecting failure of a thermal sensor in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Aspects of the present disclosure are directed to detecting a failure of thermal sensors in a memory device within a memory sub-system. A memory sub-system can be a storage device, a memory module, or a combination of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

Storage of data on certain memory devices having different media types involves a precise placement of electric charges into memory cells of the memory devices. The amount of charge placed on a memory cell can be used to represent a value stored by the memory cell. Depending on the amount of charge placed, passage of electric current through the memory cell may require an application of a value-specific threshold voltage. Readability of the memory cells depends on the distinctiveness of threshold voltages representing different stored values. Variations in temperature at which the memory sub-system is operated can impact the voltages stored in and read from the memory cell.

A memory device can be connected to one or more thermal sensors that can measure the temperature of the memory device. A memory sub-system can use the thermal sensor temperature reading to alert the host system if the memory device reaches an extreme temperature, i.e. if the memory device gets too hot or too cold, which can lead to failure of the memory device. In particular, extreme temperatures can cause the memory device to malfunction and/or become physically damaged. For example, the value of a memory cell programmed to a logic state that represents a certain value can change when it becomes extremely hot or extremely cold. If a certain number of memory cells alter their stored values due to changes in temperature, the memory device can no longer be reliable.

Memory sub-systems can be programmed to automatically stop when a thermal sensor reports extreme temperatures, and/or can send a notification to the host system to alert the host system that a memory device within the memory sub-system is at risk of failing. Additionally or alternatively, the memory sub-system can report the temperature readings directly to the host system. Detecting and reporting memory device failures can be very important to functional safety. For example, undetected memory device failures in an autonomous vehicle computer system can have catastrophic results. Hence, functioning thermal sensors can play a critical role in helping to detect and report failures of memory devices within the memory sub-system.

Thermal sensors are susceptible to failure themselves. In conventional systems, however, a thermal sensor error or failure may go undetected. For example, a failing thermal sensor can get stuck in a loop and repeatedly report the same temperature. If this temperature is within the acceptable temperature range for a memory device, the host system and/or the memory sub-system may not detect the failure in the thermal sensor.

Aspects of the present disclosure address the above and other deficiencies by having a memory sub-system that can detect failure of a thermal sensor in a memory device. The memory sub-system can include a memory sub-system controller that can designate a certain set of memory cells within a memory device as a specific group of cells that will be used in detecting a thermal sensor failure. The memory sub-system can program the designated set of memory cells to threshold voltages in between valid states that represent values in a specific pattern of values. The memory sub-system can also store pre-programmed patterns of cells, with one pattern representing the same specific pattern of values after the cells have been exposed to extreme heat, and another pattern representing the same specific pattern of values after the cells have been exposed to extreme cold. The memory sub-system can read the designated set of cells within the memory device and compare the values of the designated set of cells to the pre-programmed patterns. If the cells match one of the patterns, the memory sub-system can determine that the memory device is likely to be extremely hot or extremely cold, depending on which pre-programmed pattern of cells matches. The memory sub-system can then determine whether the thermal sensor has failed by determining whether the thermal sensor is reporting an extremely hot or extremely cold temperature.

Advantages of the present disclosure include, but are not limited to, verifying that a thermal sensor is functioning properly without the additional expense of a redundant sensor. Such verification is critical for safety in many implementations, for example, autonomous driving. Some of the technical advantages include detecting memory device failures before the failures cause irreparable damage to the memory sub-system, thus enhancing the functioning of the memory sub-system. The features described in the present disclosure can be implemented with firmware and do not require additional hardware. Furthermore, the features described in the present disclosure avoid a single point of failure using circuitry that is independent of the regular thermal sensor scheme. Additionally, the system described in the present disclosure makes use of hardware that would otherwise not be used by using non-volatile memory cells that are surplus in system blocks, thus enhancing the functioning of the memory sub-system with no added hardware. The functioning of the memory sub-system is enhanced by detecting and diagnosing failures that would otherwise go unnoticed, thus avoiding system failures and ensuring the proper functioning of the memory sub-system.

Figure 1:
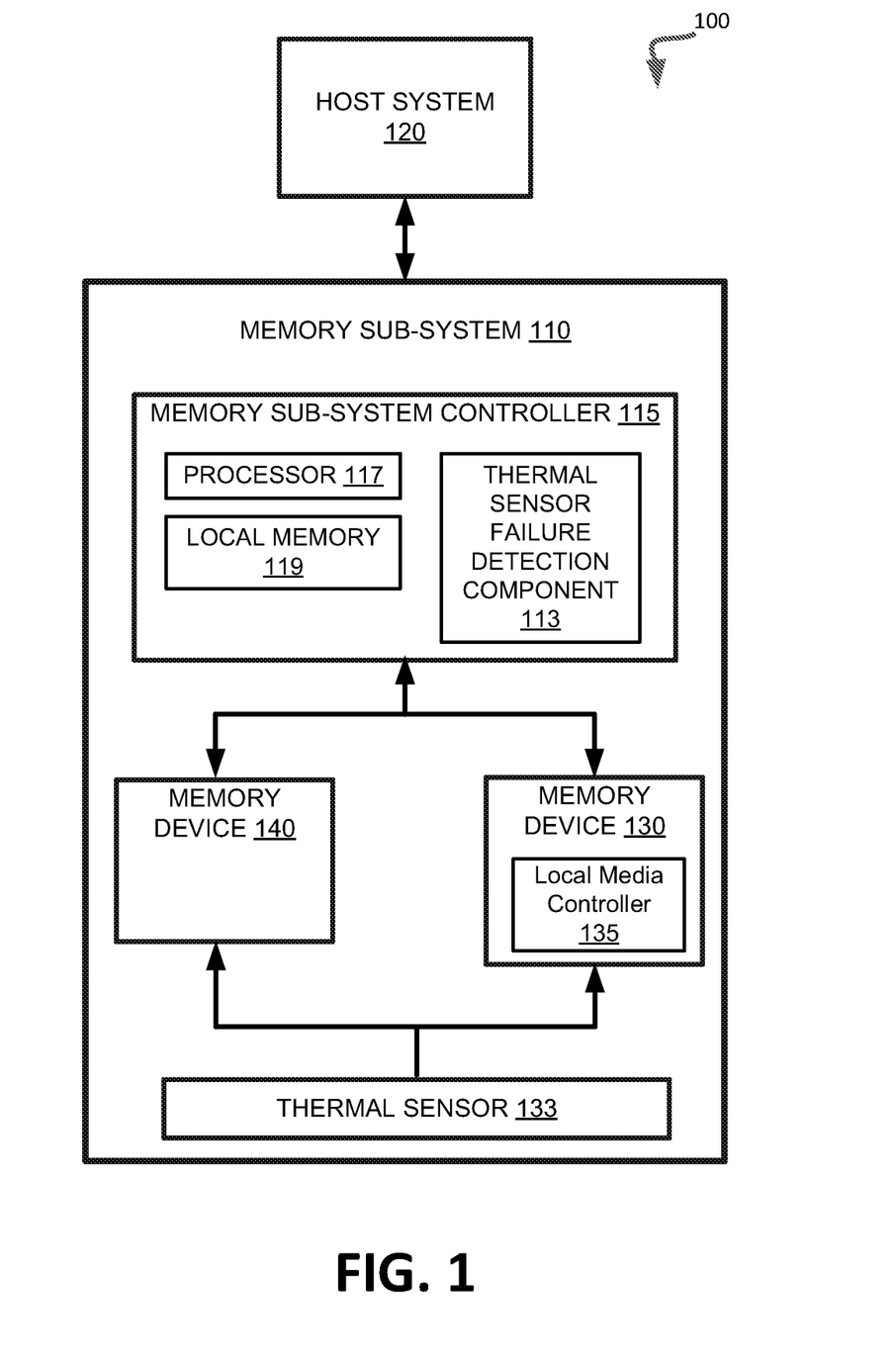
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a thermal sensor failure detection component 113 that can detect a failure of a thermal sensor connected to one or more memory devices. In some embodiments, the memory sub-system controller 115 includes at least a portion of the thermal sensor failure detection component 113. In some embodiments, the thermal sensor failure detection component 113 is part of the host system 110, an application, or an operating system. In other embodiments, local media controller 135 includes at least a portion of thermal sensor failure detection component 113 and is configured to perform the functionality described herein.

The thermal sensor failure detection component 113 can program a subset of cells within a memory device to voltage levels that are in between a specific pattern of values. The thermal sensor failure detection component 113 can also identify pre-programmed patterns within the memory device. The patterns can represent the same specific pattern of values that was programmed to the subset of memory cells, except that the pre-programmed patterns are stored within the memory device after having been exposed to extreme temperatures. For example, upon assembly, the memory cells on which a first pre-programmed pattern is stored can be placed under extreme heat for a certain amount of time. When memory cells are exposed to extreme temperatures, the values stored on the memory cells can change. Hence, after having been exposed to extreme heat, the first pre-programmed pattern can represent the values that the specific pattern of values changes to under extreme heat. The memory cells on which a second pre-programmed pattern is stored can be placed under extreme cold for a certain amount of time. The second pre-programmed pattern can represent the values that the specific pattern changes to under extreme cold. Extreme heat can be defined as above 85 degrees Celsius, and extreme cold can be defined as below minus 10 degrees Celsius, for example, although the extreme temperatures are not limited to these ranges. Nominal temperature for a memory device can be between minus 10 and 85 degrees Celsius, for example. In one embodiment, the memory cells in the patterns are not actually exposed to the extreme hot and cold temperatures, but rather are programmed to represent what the values would look like if the memory cells had been exposed to the extreme temperatures.

The subset of cells programmed to voltage levels in between valid states, and/or the memory cells stored as pre-programmed patterns of cells after having been exposed to extreme temperatures, can be stored in memory cells within memory device 130 that are otherwise unused. For example, memory devices, such as memory device 130, can include a large array of memory cells that are reserved as system blocks but that often end up not being used. The pre-programmed patterns of cells, as well as the subset of cells programmed to threshold values in-between valid states, can be cells that are within the unused array of memory cells within memory device 130.

Additionally, the subset of cells programmed to voltage levels in between valid states can be in multiple memory devices within memory sub-system 110. For example, memory sub-system 110 can include multiple non-volatile memory devices (such as memory device 130). The multiple memory devices can have one thermal sensor 133 connected to them, and in some instances, the closer the memory device is to the thermal sensor 133, the more reliable the reading can be. So while the reading from thermal sensor 133 can be accurate for the memory device(s) located near the thermal sensor 133, the reading from thermal sensor 133 can be less accurate for the memory device(s) located further away from the thermal sensor 133. Thermal sensor failure detection component 113 can program the subset of cells to voltage levels in between valid states in memory cells spread throughout all the memory devices 130 within memory sub-system 110, including both memory devices close to the thermal sensor 133 and memory devices not close to the thermal sensor 133. Alternatively, thermal sensor failure detection component 113 can program the subset of cells to voltage levels between valid states in memory devices far away from the thermal sensor 133.

The thermal sensor failure detection component 113 can then read the subset of cells that were originally programmed to voltage levels between the valid states in the specific pattern of values, and compare the subset of cells to the pre-programmed patterns. Upon determining that the subset of cells match one of the pre-programmed patterns, the thermal sensor failure detection component 113 can determine that the memory device is either extremely hot or extremely cold, depending on which pattern matches. The thermal sensor failure detection component 113 can compare a reading from a thermal sensor 133 connected to the one or more memory devices to determine whether the thermal sensor 133 has failed. For example, the thermal sensor failure detection component 113 can determine that the thermal sensor 133 has failed if the subset of cells matches the extremely hot pre-programmed pattern, but thermal sensor 133 reads a nominal temperature.

Upon determining that the thermal sensor 133 has failed, the thermal sensor failure detection component 113 can send a notification to the host system 120. The thermal sensor failure detection component 113 can perform the failure detection operations as background operations at preset intervals, for example, every 5 minutes, and send a notification, or an interrupt, to the host system 120 upon detecting a thermal sensor failure. Additionally or alternatively, the host system 120 can request that the memory sub-system 110 perform the failure detection operations described herein. Additionally or alternatively, the memory sub-system 110, through controller 115 and/or the local controller 135, can determine that the temperature readings from a thermal sensor 133 are irregular, and can then execute the failure detection operations described herein to determine whether the thermal sensor 133 is functioning properly. For example, the memory sub-system controller 115 and/or the local controller 135 can detect that the thermal sensor 133 may be malfunctioning if it repeatedly reports the same temperature for a specific amount of time. Upon detecting a potential malfunction, the memory sub-system controller 115 and/or the local controller 135 can perform the operations described herein to confirm whether the thermal sensor 133 is functioning properly. Further details with regards to the operations of the thermal sensor failure detection component 113 are described below.

In certain embodiments, the memory sub-system 110 and/or the host system 120, upon determining that a thermal sensor has filed, can switch over to a different set of memory devices in order to maintain safe functionality of the computer system.

Figure 2:
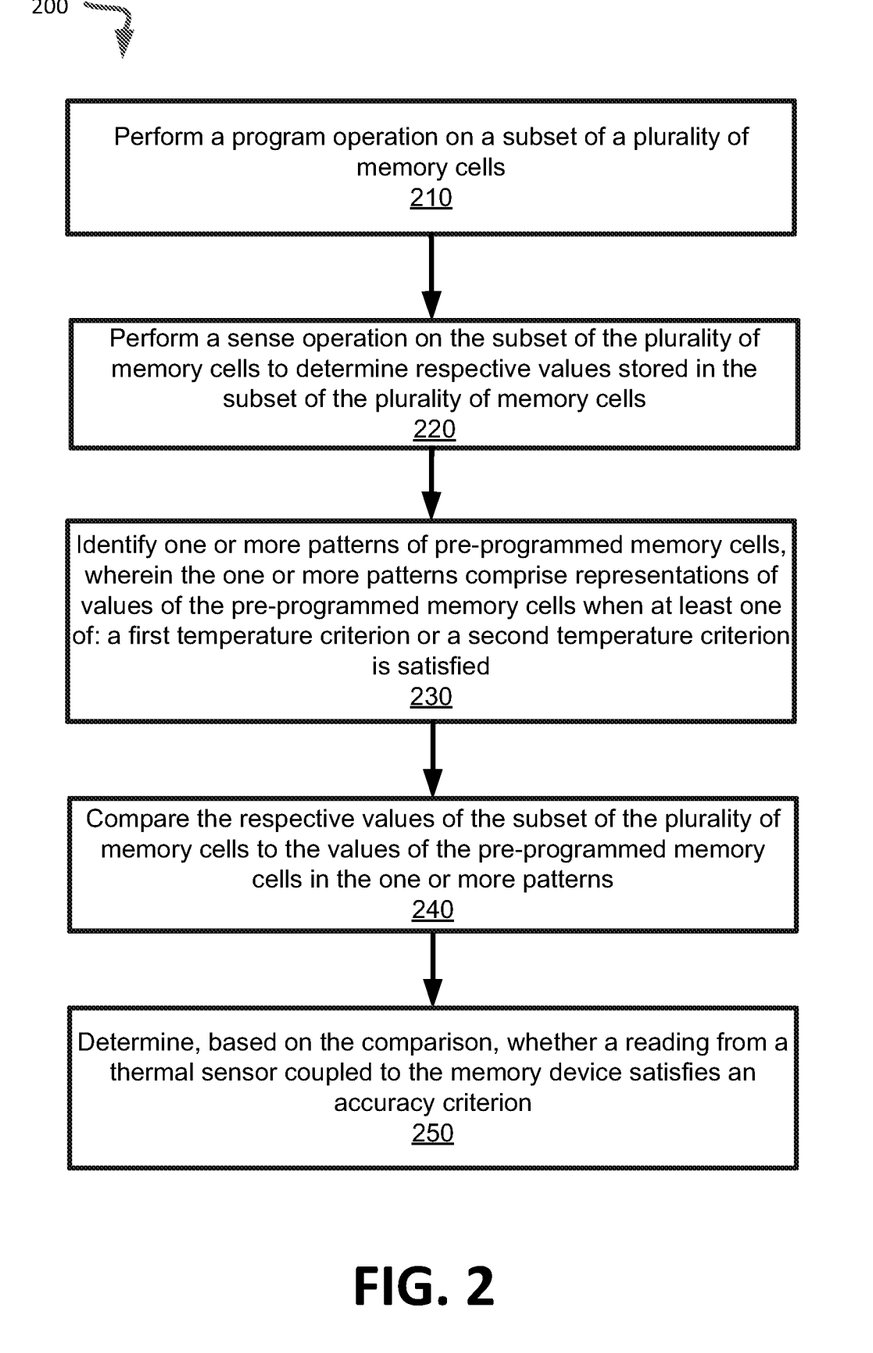
FIG. 2 is a flow diagram of an example method to detect a failure of a thermal sensor in a memory device, in accordance with some embodiments of the present disclosure.

FIG. 2 is a flow diagram of an example method 200 to detect a failure of a thermal sensor in a memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the thermal sensor failure detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 210, the processing logic can perform a program operation on a subset of a plurality of memory cells. The program operation can include programming the subset of memory cells to voltages between valid states. The valid states can represent a specific pattern of values. Programming memory cells to voltages between valid states is further described with respect to FIGS. 4A and 4B.

At operation 220, the processing logic can perform a sense operation (e.g., a read operation) on the subset of the plurality of memory cells to determine respective values stored in the subset of the plurality of memory cells. Because the subset was programmed at voltages between valid states, the memory cells have a higher likelihood of experiencing a change in value when the temperature of the memory device has reached extreme levels.

At operation 230, the processing logic can identify one or more patterns of pre-programmed cells. The pre-programmed patterns can include a first pattern that represents values of the pre-programmed memory cells satisfying a first temperature criterion, and a second pattern that represents values of the pre-programmed cells satisfying a second temperature criterion. The values of the pre-programmed memory cells in the first pattern can represent memory cells that have been programmed to the specific pattern of values and then exposed to a temperature that satisfies a first temperature criterion, i.e., a temperature that exceeds a first temperature threshold (e.g., 85 degrees Celsius). The values of the pre-programmed memory cells in the second pattern can represent memory cells that have been programmed to the specific pattern of values and then exposed to a temperature that satisfies a second temperature criterion, i.e., a temperature that is below a second temperature threshold (e.g., minus 10 degrees Celsius). The values of the pre-programmed memory cells in the first and second patterns are further described with respect to FIG. 3.

At operation 240, the processing logic can compare the respective values of the subset of the plurality of memory cells to the values of the pre-programmed memory cells in the one or more patterns. The processing logic can determine that the values of the subset of memory cells matches one of the patterns by determining that a certain number of cells within the subset match the cells in the pattern, or by determining that a certain percentage of the cells within the subset match the cells in the pattern. That is, when comparing the subset of cells to the one or more patterns, the processing logic can determine a match even if not every single memory cell value in the sets match. The processing logic can determine that the sets of cells substantially match based on a threshold number of cells matching, or a threshold percentage, for example.

At operation 250, the processing logic can determine, based on the comparison, whether a reading from a thermal sensor coupled to the memory device satisfies an accuracy criterion. In response to determining that the reading from the thermal sensor does not satisfy the accuracy criterion, the processing logic can send a notification to the host system.

In determining whether the reading from the thermal sensor satisfies the accuracy criterion, the processing logic can determine whether the reading is above a temperature threshold value or below a temperature threshold value, depending on which pattern of pre-programmed cells the subset of cells matches. That is, if the subset of memory cells matches (or substantially matches) the first pattern of pre-programmed cells, the processing logic can determine that the memory device is running hot. The processing logic can determine whether the thermal sensor is failing by comparing the reading to the "hot" temperature threshold. For example, a memory device can be considered to be running hot when a functioning thermal sensor connected to the memory device reads above 85 degrees Celsius. The processing logic can determine that thermal sensor is failing if the subset of memory cells matches the first pattern but the reading from the thermal sensor does not exceed 85 degrees Celsius.

A similar analysis can be done using a "cold" temperature threshold. That is, if the subset of memory cells matches (or substantially matches) the second pattern of pre-programmed cells, the processing logic can determine that the memory device is running cold. The processing logic can determine whether the thermal sensor is failing by comparing the reading to the "cold" temperature threshold. For example, a memory device can be considered to be running cold when a functioning thermal sensor connected to the memory device reads below minus 10 degrees Celsius. The processing logic can determine that thermal sensor is failing if the subset of memory cells matches the second pattern but the reading from the thermal sensor is not below minus 10 degrees Celsius.

Figure 3:
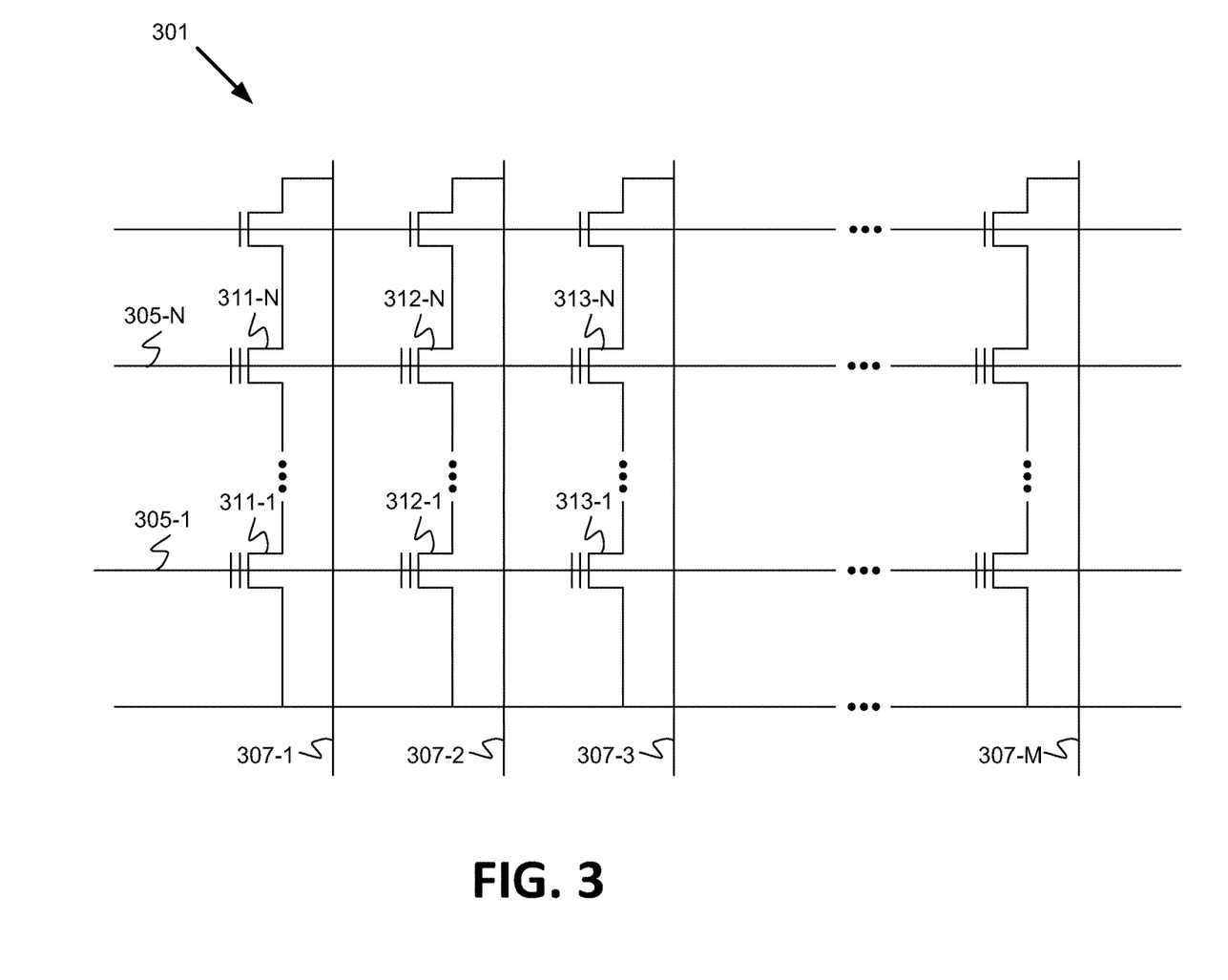
FIG. 3 illustrates a schematic diagram of a portion of non-volatile memory array in accordance with some embodiments of the present disclosure.

FIG. 3 illustrates a schematic diagram of a portion of a non-volatile memory array in accordance with a number of embodiments of the present disclosure. The memory array can be contained within one or more memory devices, such as memory device 130 illustrated in FIG. 1. The embodiment of FIG. 3 illustrates a NAND architecture non-volatile memory array. However, embodiments described herein are not limited to this example. A memory device can be made up of bits arranged in a two-dimensional grid. The memory array 301 includes memory cells 311-1 to 311-N, 312-1 to 312-N, 313-1 to 313-N that are etched onto a silicon wafer in an array of columns 307-1 to 307-M (also hereinafter referred to as bitlines) and rows 305-1 to 305-N (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types.

As shown in FIG. 3, the memory array 301 includes a number of NAND strings, where each NAND string includes non-volatile memory cells 311-1 to 311-N, each communicatively coupled to a respective wordline 305-1 to 305-N. Each NAND string (and its constituent memory cells) is also associated with a local bitline (i.e., one of local bitlines 307-1 to 307-M). The memory cells 311-1 to 311-N of each NAND string are coupled in series, source to drain, between a source select gate (SGS) and a drain select gate (SGD). Each source select gate is configured to selectively couple a respective NAND string to a common source responsive to a signal on source the select line, while each drain select gate is configured to selectively couple a respective NAND string to a respective bitline responsive to a signal on the drain select line.

In a number of embodiments, construction of the non-volatile memory cells 311-1 to 311-N includes a source, a drain, a floating gate or other charge storage structure, and a control gate. The memory cells 311-1 to 311-N have their control gates coupled to a wordline, 305-1 to 305-N, respectively. A number (e.g., a subset or all) of cells coupled to a selected wordline can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular wordline and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state. Read operations can include sensing a voltage and/or current change of a bitline coupled to a selected cell in order to determine the state of the selected cell. The read operation can include precharging a bitline and sensing the discharge when a selected cell begins to conduct.

According to some embodiments of the present disclosure, memory sub-system 110 can store (on local memory 119, for example) the values of a pre-programmed pattern of memory cells that have been exposed to extreme heat and to extreme cold. For example, memory cells 311-1 to 311-N can have been programmed to a specific pattern of values and then exposed to extreme heat for a certain amount of time. The values of memory cells 311-1 to 311-N after having been exposed to extreme heat (referred to the first pattern of pre-programmed cells) can then be stored in memory sub-system 110 (e.g., on local memory 119). To further the example, memory cells 312-1 to 312-N can have been programmed to the same specific pattern of values and then exposed to extreme cold for a certain amount of time. The values of memory cells 312-1 to 312-N after having been exposed to extreme cold (referred to the second pattern of pre-programmed cells) can then be stored in memory sub-system 110 (e.g., on local memory 119). In some embodiments, the memory cells programmed to voltage levels in between valid states, as well as the memory cells used to store the pre-programmed patterns representing the valid states after having been exposed to extreme temperatures, can be stored in more than one managed NAND device, and need not be consecutive as is depicted in FIG. 3.

Thermal sensor failure detection component 113 of FIG. 1 can program a subset of cells (e.g., 313-1 to 313-N) to voltage levels corresponding to a targeted state that represents in-between valid states. The valid states can be the same as the specific pattern of values that memory cells 311-1 to 311-N and 312-1 to 312-N were programmed to before being exposed to extreme temperatures. Memory cells 313-1 to 313-N, however, can be programmed to voltage levels that represent values in between the specific pattern of values. For example, if the programming operation to program memory cells 311-1 to 311-N included applying a number of program pulses between 16V and 20V, then the programming operation to program memory cells 313-1 to 313-N can include applying a number of program pulses between 18V and 22V.

Thermal sensor failure detection component 113 can then read the subset of cells (memory cells 313-1 to 313-N in this example) and compare the values to the first and second patterns of pre-programmed cells (in this example, memory cells 311-1 to 311-N and 312-1 to 312-N respectively). Based on this comparison, thermal sensor failure detection component 113 can determine whether the memory sub-system is running extremely hot, extremely cold, or at a nominal temperature. Specifically, if the memory cells 313-1 to 313-N match the first pattern of pre-programmed cells, thermal sensor failure detection component 113 can determine that the memory sub-system is running extremely hot, since the memory cells 313-1 to 313-N match the cells that have previously been exposed to extreme heat. Similarly, if the memory cells 313-1 to 313-N match the second pattern of pre-programmed cells, thermal sensor failure detection component 113 can determine that the memory sub-system is running extremely cold, since the memory cells 313-1 to 313-N match the cells that have previously been exposed to extreme cold.

The subset of cells programmed to values in between valid states does not need to match every cell in the first pattern or the second pattern in order for the sensor failure detection component 113 to determine that the cells match the pattern. For example, the memory sub-system 110 and/or the host system 120 can set a threshold number of cells that need to match in order to be considered a match, or a threshold percentage of cells that need to match. For example, the threshold percentage can be set to 80%, and so if the thermal sensor failure detection component 113 determines that 80% or more of the cells in the subset of cells (e.g., memory cells 313-1 to 313-N) match the values in the first pattern of pre-programmed cells, then the thermal sensor failure detection component 113 can determine that the memory device is running extremely hot.

Thermal sensor failure detection component 113 can then determine whether the thermal sensor has failed by determining whether a reading from the thermal sensor attached to the memory device reads as extremely hot (e.g., above 85 degrees Celsius) or extremely cold (e.g., below minus 10 degrees Celsius), as the case may be. For example, if the subset of cells (e.g., memory cells 313-*a* to 313-N) match (or substantially match) the first pattern of pre-programmed cells, and the reading from the thermal sensor reads below 85 degrees Celsius, the thermal sensor failure detection component 113 can determine that the thermal sensor has failed. Similarly, if the subset of cells (e.g., memory cells 313-*a* to 313-N) match (or substantially match) the second pattern of pre-programmed cells, and the reading from the thermal sensor reads above minus 10 degrees Celsius, the thermal sensor failure detection component 113 can determine that the thermal sensor has failed.

In some embodiments, in response to determining that the subset of cells (e.g., memory cells 313-*a* to 313-N) do not match (or substantially match) the first or the second pattern of pre-programmed cells, the thermal sensor failure detection component 113 can determine that the thermal sensor has failed if the reading from the thermal sensor is not nominal, i.e., is the extremely high threshold or below the extremely low threshold.

Figure 4A:
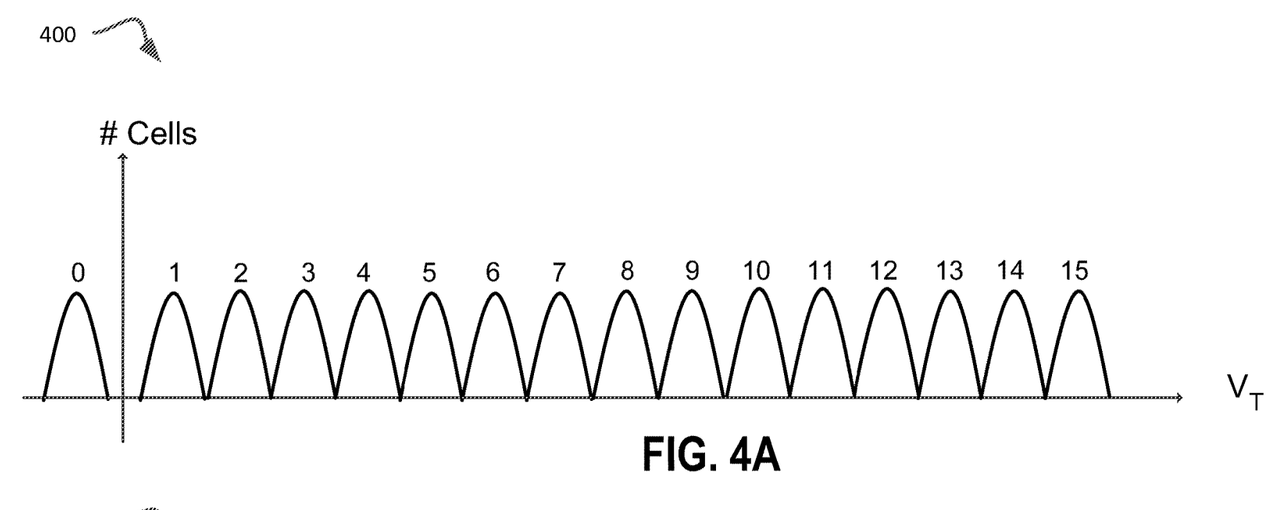
FIG. 4A depicts distributions of threshold voltages for a memory cell capable of storing bits of data, in accordance with some embodiments of the present disclosure.
Figure 4B:
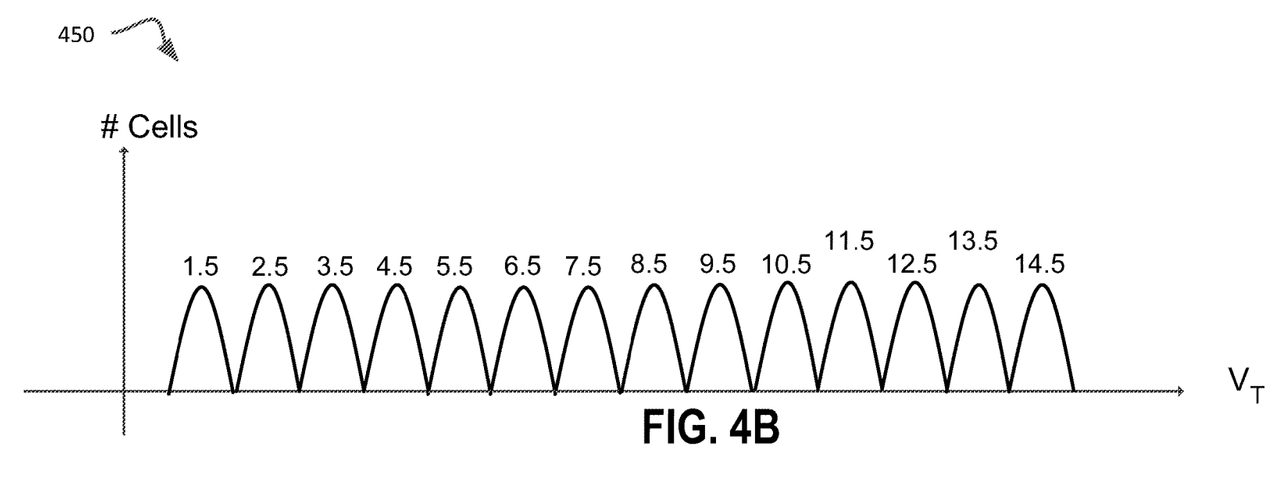
FIG. 4B depicts distribution of threshold voltages for a memory cell programmed to values in between valid states, in accordance with some embodiments of the present disclosure.

FIGS. 4A and 4B illustrate various possible threshold voltage distributions for programmed states in accordance with a number of embodiments of the present disclosure. The examples shown in FIGS. 4A and 4B can represent, for example, memory cells in a block of memory device 130, previously described in connection with FIG. 1. In some embodiments, the distributions shown in FIGS. 4A and 4B can describe states of transistor-based memory cells, such as metal-oxide-semiconductor field effect transistor (MOSFET) memory cells.

FIG. 4A depicts distributions of threshold voltages for a memory cell capable of storing for bits of data, in accordance with some embodiments of the present disclosure. The example shown in FIG. 4A represents 16 different charge states of a memory cell configured as quad-level cell (QLC) memory. The numbers 0, 1, . . . 15 enumerate various states of the memory cell. For example, a memory cell programmed into a charge state 0 can represent stored value 1111, state 1 can represent stored value 0111, state 2 can represent stored value 0011, and so on. However, embodiments of the present disclosure are not limited to this example.

The memory sub-system can have a certain set of memory cells that have been programmed to threshold voltages representing valid states, as illustrated in FIG. 4A. A first set of cells programmed to a certain pattern of valid states can be exposed to extreme heat, above a temperature threshold (e.g., above 85 degrees Celsius), and a second set of cells programmed to the same pattern of valid states can be exposed to extreme cold, below a temperature threshold (e.g., below minus 10 degrees Celsius). The values of these sets of cells can then be saved, for example on local memory 119. It can be expected that the value of a certain number of memory cells will have changed as a result of having been exposed to extreme temperatures.

FIG. 4B illustrates a diagram 450 of threshold voltage distributions for programmed values in between valid states, in accordance with a number of embodiments of the present disclosure. Depicted in FIG. 4B are distributions 1.5, 2.5, 3.5, 4.5, 5.5, 6.5, ..., 14.5 which represent distributions of voltages between valid states in a memory cell configured as QLC memory. That is, the voltage levels are shifted to the valleys in between the valid states.

When there is not enough separation between respective threshold voltage of two consecutive states (or bit levels), an error can occur, such as a bit flip. Typically, as described above, each binary value stored in a memory cell has a different threshold voltage associated with it, with the lowest binary value having the highest threshold voltage, the highest binary value having the lowest threshold voltage, and intermediate states having progressively different threshold voltage values. For example, a memory cell configured as QLC memory has sixteen states, each state having a corresponding $V_t$, as depicted in FIG. 4A.

FIG. 4B depicts the threshold voltages of the subset of cells that the thermal sensor failure detection component 113 can use in determining whether the thermal sensor has failed. As the level separation in voltages become shifted due to changes in environmental conditions, the values stored in the memory cells can change (or flip). The subset of cells that are programmed to levels between valid states, as depicted in FIG. 4B, have a higher likelihood of shifting when exposed to extreme temperatures, since the cells are already partly shifted. That is, by placing the voltage level between valid states, the cell is likely to read as one value at one temperature range, and another value at another temperature range. As such, the thermal sensor failure detection component 113 is more likely to determine that the memory device is running at an extreme temperature when reading the voltage levels of the cells that have been programmed to in-between valid states.

Figure 5:
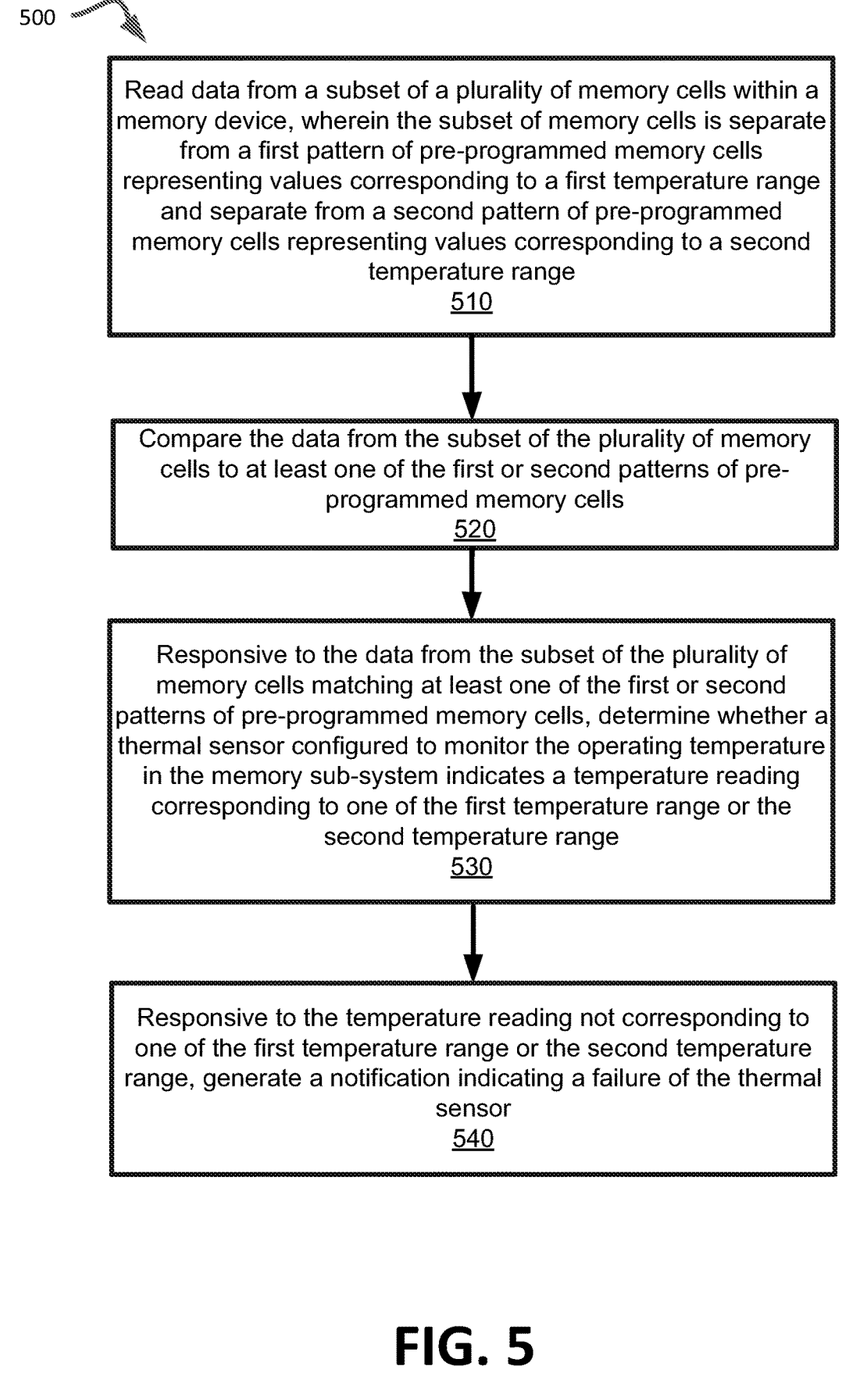
FIG. 5 is a flow diagram of an example method to detect a failure of a thermal sensor in a memory device, in accordance with some embodiments of the present disclosure.

FIG. 5 is a flow diagram of an example method 500 to detect a failure of a thermal sensor in a memory device, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the thermal sensor failure detection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing logic can read data from a subset of a plurality of memory cells within the memory device. The plurality of memory cells within the memory device can include a first pattern of pre-programmed memory cells representing values corresponding to a first temperature range, and a second pattern of pre-programmed cells representing values corresponding to a second temperature range. That is, the pre-programmed patterns of memory cells within the plurality of memory cells each represent values of a memory cells that were programmed to a specific pattern of values, and then exposed to a temperature range. For example, the first pattern of pre-programmed cells can represent the values of the memory cells programmed to the specific pattern after it has been exposed to extreme heat (e.g., a first temperature range that includes temperatures above 85 degrees Celsius) for a certain period of time. The second pattern of pre-programmed cells can represent the values of the memory cells programmed to the same specific pattern after being exposed to extreme cold (e.g., a second temperature range that includes temperatures below minus 10 degrees Celsius) for a certain period of time. Exposing the memory cells to extreme temperatures can alter their states (i.e., alter the values stored within the memory cells), and can represent the values that the specific pattern change to when exposed to extreme temperatures. In one embodiment, the memory cells in the patterns are not actually exposed to the extreme hot and cold temperatures, but rather are programmed to represent what the values would look like if the memory cells had been exposed to the extreme temperatures.

The subset of plurality of memory cells that the processing logic can read at operation 510 can be separate from the first and second patterns of pre-programmed cells. In some embodiments, prior to reading the data from the subset of memory cells, the processing logic can have previously programmed the subset of cells to voltage levels between valid states. The valid states can represent a specific pattern of values. Programming memory cells to voltages between valid states is further described with respect to FIGS. 4A and 4B.

At operation 520, the processing logic can compare the data from the subset of the plurality of memory cells to the first pattern and/or the second pattern of pre-programmed memory cells. Comparing the subset of cells to the first and/or second patterns can include determining that a threshold number of the values in the subset match the values in the first pattern and/or second pattern. That is, not every cell in the subset needs to match the first pattern or second pattern in order to determine that the subset matches the first pattern or second pattern. The processing logic can determine that the sets of cells substantially match based on a threshold number of cells matching, or a threshold percentage, for example.

At operation 530, in response to determining that the data from the subset of cells matches either the first pattern or the second pattern, the processing logic can determine whether the memory device is running at a temperature that falls within the temperature range corresponding to the matched pattern of pre-programmed cells. The memory device can include a thermal sensor configured to monitor the operating temperature in the memory sub-system. The processing logic can determine whether the thermal sensor indicates a temperature reading corresponding to either the first temperature or the second temperature range.

At operation 540, in response to determining that the temperature reading of the thermal sensor does not correspond to either the first or the second temperature range, the processing logic can generate a notification indicating a failure of the thermal sensor. The processing logic can transmit the notification to a host system.

In on embodiment, in response to determining that the data from the subset of cells does not match either the first pattern or the second pattern of pre-programmed cells, the processing logic can check whether the thermal sensor is functioning properly by determining whether the thermal sensor indicates a nominal temperature. Hence, when the subset of cells does not match either the first pattern or the second pattern, the processing logic can determine whether the temperature reading of the thermal sensor corresponds to one of the temperature ranges. Responsive to determining that the temperature reading corresponds to one either the first or second temperature range (i.e., the temperature reading falls within one of the extreme temperature ranges and is not nominal), the processing logic can generate a notification indicating a failure of the thermal sensor. The processing logic can transmit the notification to a host system.

Figure 6:
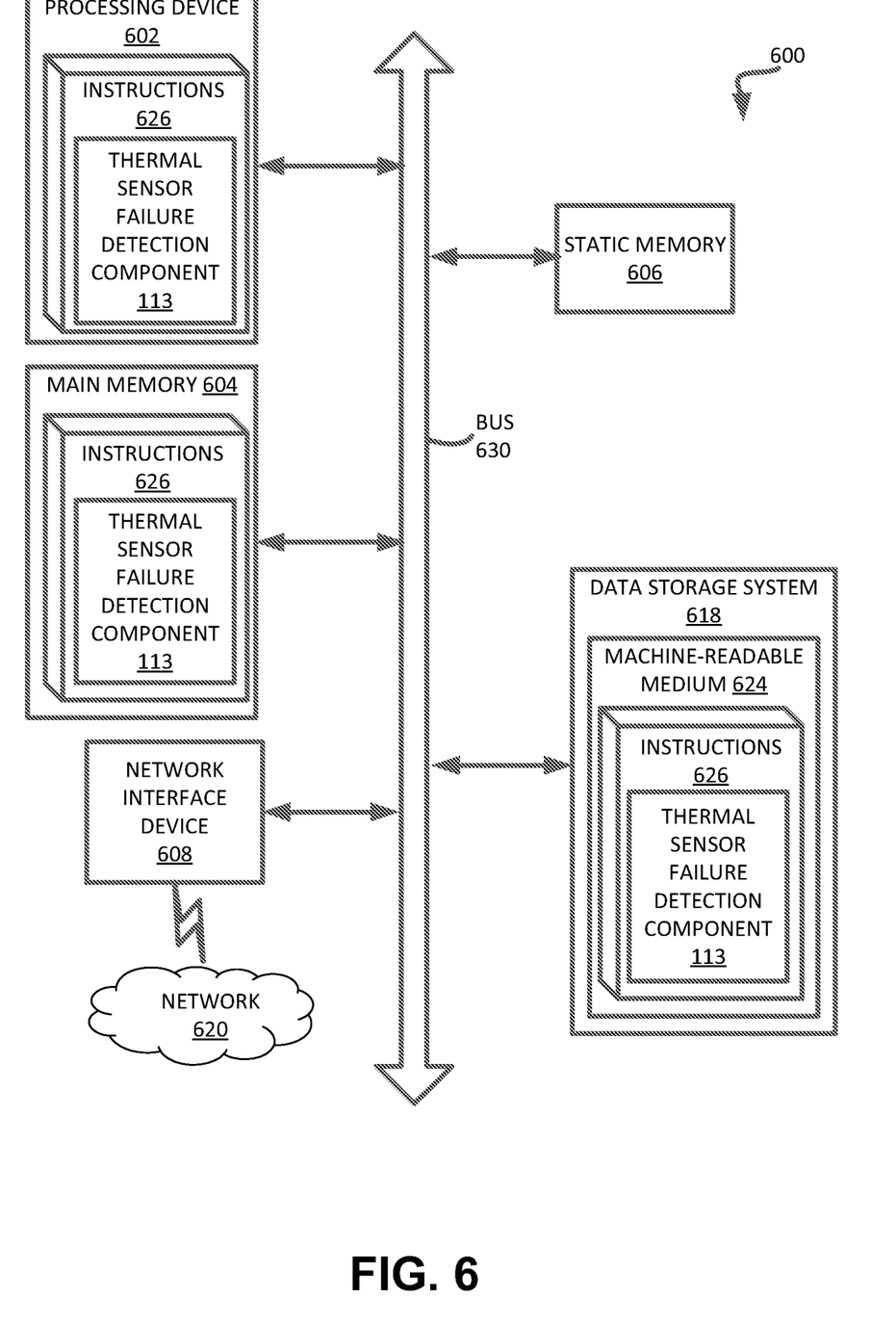
FIG. 6 is a block diagram of an example computer system in which embodiments of the present disclosure may operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the thermal sensor failure detection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or RDRAM, etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to a thermal sensor failure detection component (e.g., the thermal sensor failure detection component 113 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device comprising a plurality of memory cells; and
a processing device, operatively coupled with the memory device, to perform operations comprising:
comparing respective values of a subset of the plurality of memory cells to a pattern of pre-programmed memory cells on the memory device, wherein the pattern of pre-programmed memory cells comprises representations of values of the pattern of pre-programmed memory cells when a temperature criterion is satisfied;
responsive to determining that at least a threshold number of the respective values of the subset matches the pattern of pre-programmed memory cells, identifying a temperature reading from a thermal sensor coupled to the memory device; and
responsive to determining that the temperature reading does not correspond to the temperature criterion, determining that the thermal sensor has failed.

2. The system of claim 1, wherein the processing device is to perform operations further comprising:
programming the subset of the plurality of memory cells to voltages between valid states of the memory cells.

3. The system of claim 1, wherein the processing device is to perform operations further comprising:
responsive to determining that the thermal sensor has failed, sending a notification to a host system.

4. The system of claim 1, wherein the processing device is to perform operations further comprising:
performing a program operation on the subset of the plurality of memory cells; and
performing a sense operation on the subset of the plurality of memory cells to determine the respective values stored in the subset of the plurality of memory cells.

5. The system of claim 1, wherein the temperature criterion is satisfied in response to determining that the pattern represents at least one of: a first set of cells programmed at a first temperature exceeding a first temperature threshold, or a second set of cells programmed at a second temperature below a second temperature threshold.

6. The system of claim 1, wherein the processing device is to perform operations further comprising:
responsive to determining that a number of temperature readings over a certain time period satisfies a criterion, performing the comparing of the respective values of the subset of the plurality of memory cells to the pattern of pre-programmed memory cells on the memory device.

7. The system of claim 6, wherein the criterion is satisfied by determining that respective values of the number of temperature readings over the certain time period match.

8. The system of claim 1, wherein the processing device performs the operations at a predetermined time interval.

9. A method comprising:
comparing respective values of a subset of a plurality of memory cells of a memory device to a pattern of pre-programmed memory cells of the memory device, wherein the pattern of pre-programmed memory cells comprises representations of values of the pattern of pre-programmed memory cells when a temperature criterion is satisfies;
responsive to determining that at least a threshold number of the respective values of the subset matches the pattern of pre-programmed memory cells, identifying a temperature reading from a thermal sensor coupled to the memory device; and
responsive to determining that the temperature reading does not correspond to the temperature criterion, determining that the thermal sensor has failed.

10. The method of claim 9, further comprising:
programming the subset of the plurality of memory cells to voltages between valid states of the memory cells.

11. The method of claim 9, further comprising:
responsive to determining that the thermal sensor has failed, sending a notification to a host system.

12. The method of claim 9, further comprising:
performing a program operation on the subset of the plurality of memory cells; and
performing a sense operation on the subset of the plurality of memory cells to determine the respective values stored in the subset of the plurality of memory cells.

13. The method of claim 9, wherein the temperature criterion is satisfied in response to determining that the pattern represents at least one of: a first set of cells programmed at a first temperature exceeding a first temperature threshold, or a second set of cells programmed at a second temperature below a second temperature threshold.

14. The method of claim 9, further comprising:
responsive to determining that a number of temperature readings over a certain time period satisfies a criterion, performing the comparing of the respective values of the subset of the plurality of memory cells to the pattern of pre-programmed memory cells on the memory device.

15. The method of claim 14, wherein the criterion is satisfied by determining that respective values of the number of temperature readings over the certain time period match.

16. The method of claim 9, wherein the comparison is performed at a predetermined time interval.

17. A memory sub-system comprising:
a memory device comprising a plurality of memory cells, the plurality of memory cells including a pattern of pre-programmed memory cells representing values corresponding to a temperature range;
a thermal sensor configured to monitor an operating temperature in the memory sub-system; and
a processing device, operatively coupled with the memory device, to perform operations comprising:
comparing respective values of a subset of the plurality of memory cells the pattern of pre-programmed memory cells;
responsive to determining that at least a threshold number of the respective values of the subset matches the pattern of pre-programmed memory cells, identifying a temperature reading from the thermal sensor; and
responsive to determining that the temperature reading does not correspond to the temperature range, determine that the thermal sensor has failed.

18. The memory sub-system of claim 17, wherein the processing device is to perform operations further comprising:
programming the subset of the plurality of memory cells to voltages between valid states of the memory cells; and
reading data from the subset of the plurality of memory cells.

19. The memory sub-system of claim 17, wherein the temperature range represents at least one of: temperatures above a first temperature threshold value or temperatures below a second temperature threshold value.

20. The memory sub-system of claim 17, wherein the processing device is to perform operations further comprising:
responsive to determining that the thermal sensor has failed, generating a notification indicating that the thermal sensor has failed.

* * * * *